United States Patent
Singh et al.

(10) Patent No.: US 10,171,105 B2
(45) Date of Patent: Jan. 1, 2019

(54) CARRY-LESS POPULATION COUNT

(71) Applicant: INTERNATIONAL BUSINESS MACHINES CORPORATION, Armonk, NY (US)

(72) Inventors: Deepak K. Singh, Apex, NC (US); Monty M. Denneau, Brewster, NY (US); Brian M. Rogers, Durham, NC (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 21 days.

(21) Appl. No.: 15/247,192

(22) Filed: Aug. 25, 2016

(65) Prior Publication Data
US 2018/0062664 A1    Mar. 1, 2018

(51) Int. Cl.
| | | |
|---|---|---|
| *H03M 7/46* | (2006.01) | |
| *G06F 7/00* | (2006.01) | |
| *G06F 7/60* | (2006.01) | |

(52) U.S. Cl.
CPC ............ *H03M 7/46* (2013.01); *G06F 7/00* (2013.01); *G06F 7/607* (2013.01)

(58) Field of Classification Search
CPC ........................................... G06F 7/607
USPC ........................................... 708/210
See application file for complete search history.

(56) References Cited

U.S. PATENT DOCUMENTS

| | | | |
|---|---|---|---|
| 4,189,716 A | | 2/1980 | Krambeck |
| 5,095,458 A | * | 3/1992 | Lynch .................. G06F 7/49 |
| | | | 708/704 |
| 5,541,865 A | | 7/1996 | Ashkenazi |
| 5,717,616 A | * | 2/1998 | Morris .................. G06F 7/607 |
| | | | 708/210 |
| 5,734,599 A | | 3/1998 | Lee et al. |
| 6,430,251 B1 | | 8/2002 | Gold |

(Continued)

FOREIGN PATENT DOCUMENTS

| | | |
|---|---|---|
| EP | 0416869 A2 | 3/1991 |
| EP | 0741354 A2 | 11/1996 |
| EP | 2138931 A1 | 12/2009 |
| JP | 2005165793 A * | 6/2005 |

OTHER PUBLICATIONS

Meng et al., "Calculating Bounds on Information Leakage Using Two-Bit Patterns," Proceedings of the ACM SIGPLAN 6th Workshop Security. ACM, 2011, pp. 1-12.

*Primary Examiner* — Matthew D Sandifer
*Assistant Examiner* — Emily E Larocque
(74) *Attorney, Agent, or Firm* — Cantor Colburn LLP; Rabin Bhattacharya

(57) ABSTRACT

Technical solutions are described for determining a population count of an input bit-string. In an example, a population count circuit receives a single n-bit input data word including of bits A[n−1:0]. The population count circuit isolates a pair of 4-bit nibbles. The population count circuit includes a carryless counter circuit that determines a pair of counts of 1s, one for each 4-bit nibble. The population circuit further includes an adder circuit that determines the population count by summing the pair of counts of 1s from the carryless counter circuit, where the adder circuit determines the most significant bit (MSB) of the sum based on the MSBs of the counts of 1s only, without depending on carry propagation.

16 Claims, 6 Drawing Sheets

(56) References Cited

U.S. PATENT DOCUMENTS

| | | | |
|---|---|---|---|
| 6,729,168 B2 * | 5/2004 | Hossain | G06F 7/607 |
| | | | 70/210 |
| 7,082,453 B1 | 7/2006 | Shackleford et al. | |
| 7,958,173 B2 | 6/2011 | Moyer et al. | |
| 8,661,072 B2 * | 2/2014 | Blaner | G06F 7/505 |
| | | | 708/629 |
| 2002/0147756 A1 | 10/2002 | Hatsch et al. | |
| 2009/0019100 A1 | 1/2009 | Moyer et al. | |
| 2012/0150933 A1 | 6/2012 | Boersma et al. | |

\* cited by examiner

Input data word A[n-1:0] = [ A[n-1] | A[n-2] | A[n-2] ] ....... [ A[3] | A[2] | A[1] | A[0] ]

4:3 Carryless Counter for Pop Count (input=4-bit nibble, output=3-bit count)
For i=0,1,2,...,n/4 where n=number of bits in input data word

| A[4*i+3] input | A[4*i+2] input | A[4*i+1] input | A[4*i] input | c2[i] output | c1[i] output | c0[i] output |
|---|---|---|---|---|---|---|
| 0 | 0 | 0 | 0 | 0 | 0 | 0 |
| 0 | 0 | 0 | 1 | 0 | 0 | 1 |
| 0 | 0 | 1 | 0 | 0 | 0 | 1 |
| 0 | 0 | 1 | 1 | 0 | 1 | 0 |
| 0 | 1 | 0 | 0 | 0 | 0 | 1 |
| 0 | 1 | 0 | 1 | 0 | 1 | 0 |
| 0 | 1 | 1 | 0 | 0 | 1 | 0 |
| 0 | 1 | 1 | 1 | 0 | 1 | 1 |
| 1 | 0 | 0 | 0 | 0 | 0 | 1 |
| 1 | 0 | 0 | 1 | 0 | 1 | 0 |
| 1 | 0 | 1 | 0 | 0 | 1 | 0 |
| 1 | 0 | 1 | 1 | 0 | 1 | 1 |
| 1 | 1 | 0 | 0 | 0 | 1 | 0 |
| 1 | 1 | 0 | 1 | 0 | 1 | 1 |
| 1 | 1 | 1 | 0 | 0 | 1 | 1 |
| 1 | 1 | 1 | 1 | 1 | 0 | 0 |

CARRY-LESS POPULATION COUNT

STATEMENT OF GOVERNMENT INTEREST

This invention was made with Government support under Contract No.: H98230-13-D-0122/003 P 005 awarded by Renewable Energy Source (RES). The Government has certain rights in this invention.

BACKGROUND

The present application relates to computer operations implemented in hardware and particularly hardware that performs a population count.

Typically, computing systems use electronic circuitry that is referred to as arithmetic logic units (ALUs) to perform arithmetic operations. In addition to ALUs, high performance computing systems include additional special hardware that accelerates performance of specific arithmetic operations. For example, a computing system may include hardware devoted to performing multiplication, division, matrix operations, and other such specific arithmetic operations. In addition, computing systems include hardware and/or logic to perform a population count. A population count refers to counting the number of "1"s in a string of bits, or a vector. For example, the bit pattern "01111001" has a population count of 5. The population count of a string is useful for many applications, such as cryptographic analysis.

SUMMARY

According to one or more embodiments, a population count circuit that determines a population count of an input bit-string, where the population count is a number of is in the input bit-string, includes an input interface configured to receive a single n-bit input data word including of bits a[n−1:0]. The population count circuit further includes a logic device configured to isolate a pair of 4-bit nibbles of an n-bit input bit-string. The population count circuit further includes a carryless counter circuit configured to determine a pair of counts of 1s, one for each 4-bit nibble from the pair of 4-bit nibbles. The population count circuit further includes an adder circuit configured to determine the population count of is from the carryless counter circuit corresponding to each 4-bit nibble. The adder circuit is a specialized adder circuit that determines the most significant bit (MSB) of the sum based on the MSBs of the counts of is only, without depending on carry propagation.

According to one or more embodiments, a system for facilitating determination of population count of a bit-string, includes a register file, and a processor coupled with the register file. The processor receives a command to determine the population count of the bit-string. The processor determines a pair of counts of 1s, one for each 4-bit nibble from a pair of 4-bit nibbles from the bit-string. The processor adds the pair of counts of 1s corresponding to each 4-bit nibble, by determining the most significant bit (MSB) of the sum based on the MSBs of the counts of 1s only, without depending on carry propagation.

According to one or more embodiments, a computer program product for determining a population count for a bit-string includes a computer readable storage medium. The computer readable storage medium includes computer executable instructions to divide an input bit-string into 4-bit nibbles. The computer readable storage medium also includes instructions to determine 3-bit population count values corresponding to the 4-bit nibbles respectively. The computer readable storage medium also includes instructions to propagate the 3-bit population count values through a sequential tree of additions, where the tree includes $\log_2(n/4)$ levels, where n is the number of bits in the input bit-string. At level k of the tree, population count results from a level k−1 of the tree in consecutive pairs are used to determine the most significant bit (MSB) of the sum based on the MSBs of the count values only, without depending on carry propagation. At level k of the tree, results from a level k−1 of the tree are added for sum bits other than the MSB. The computer readable storage medium also includes instructions to output result of additions at level $\log_2(n/4)$ of the tree as the population count of the input bit-string.

BRIEF DESCRIPTION OF THE DRAWINGS

The examples described throughout the present document may be better understood with reference to the following drawings and description. The components in the figures are not necessarily to scale. Moreover, in the figures, like-referenced numerals designate corresponding parts throughout the different views.

FIG. 2 illustrates a table for encoding a 4-bit string (nibble) into a 3-bit population count in accordance with one or more embodiments.

DETAILED DESCRIPTION

Figure 1:
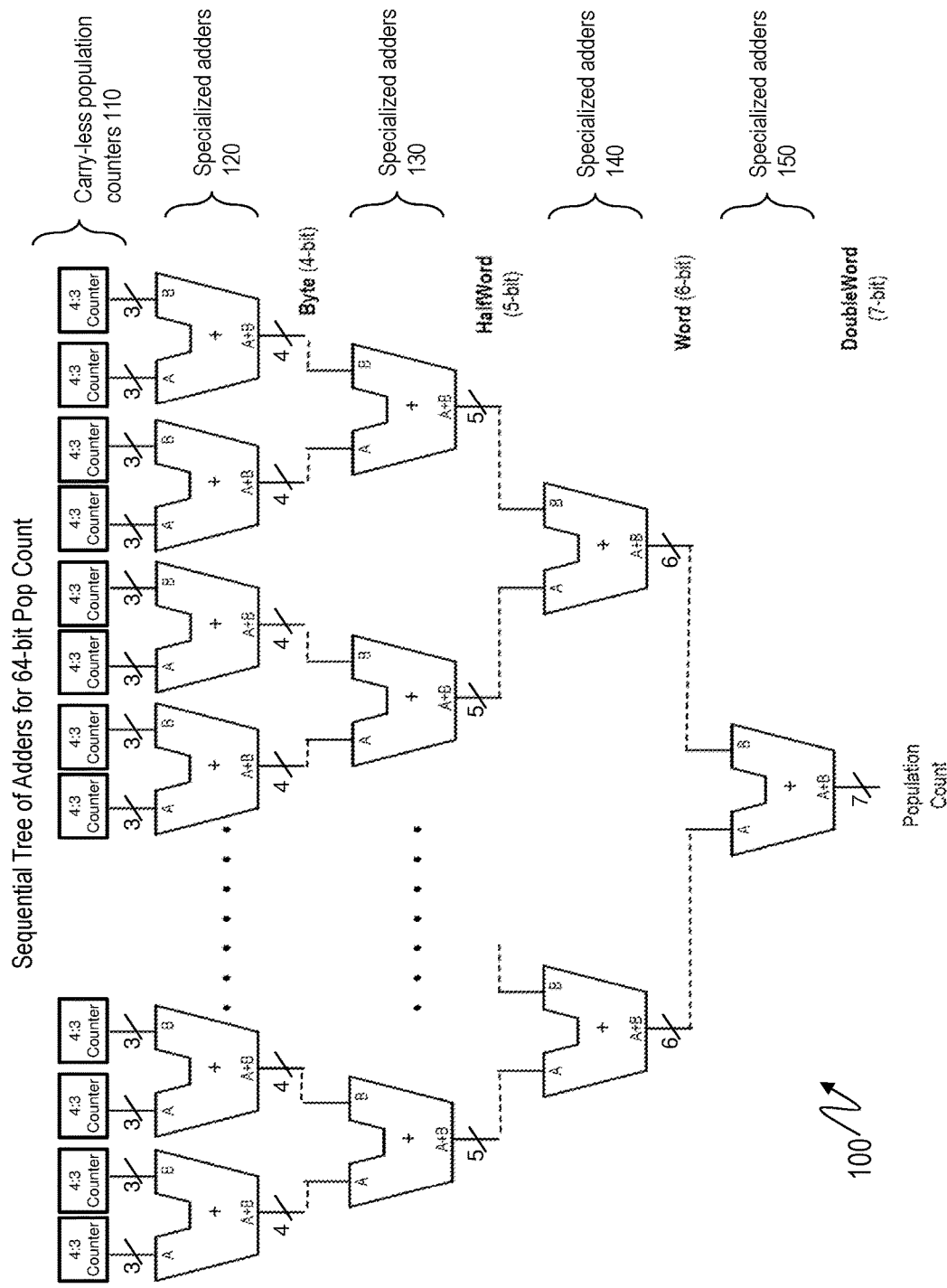
FIG. 1 illustrates an example circuit for generating a population count of input data using a tree of sequential adders in accordance with one or more embodiments.

Disclosed here are technical solutions for computing a population count for a string of bits. The technical solutions are rooted in and/or tied to computer technology in order to address a problem specifically arising in the realm of computers, specifically computing arithmetic operations using electronic circuitry.

Typically, electronic circuitry, such as a processor or an ALU implements a population count instruction, which takes a single operand, such as from a processor register, and computes the population count over the operand and returns the result. The result may be stored to a register. In one or more examples, population count is performed on individual pieces of the input binary string contained in the register, where the number of such pieces is dependent on the register size. The result from each piece is then summed to produce the final population count result.

For speed and efficiency reasons, a population count instruction is implemented to execute in a single CPU cycle. However, because the population count function is computationally complex, implementing a single-cycle population count instruction becomes problematic for very high-performance, high clock frequency CPUs. Compounding the speed problem is the current trend toward computers with wider data widths. The industry trend today is away from 32 bits and toward 64 or more bits. This means a population count instruction computes a population count across twice the number of bits as in the past, which takes more time to perform. The time delay of the population count function is approximately proportional to the log of the number of bits in the operand ($\log_2(n)$, where n is the number of bits). Accordingly, a population count over 16 bits might take 4 time units, over 32 bits 5 time units and over 64 bits 6 time units, and so on.

A technical problem with the typical methods for computing population counts is the time required for the entire "add" process to occur. Because full adders are used, sufficient time has to be allowed for the carry bits from each level of the adders to propagate to produce the final result. For example, in a 2-bit adder adding two binary bit streams or inputs "11" and "01", time is permitted for the carry from the least significant bit addition to carry to the next least significant position and finally for the carry to occur into the most significant bit position to generate the correct answer "100". The subsequent 3-bit adders cannot generate a correct answer until the 2-bit results stabilize and sufficient time expires for the carries generated by the 3-bit adders to propagate. This process continues for each subsequent level and the cumulative delay to allow for all the possible "carries" is significant. Even with carry lookahead schemes, the carries have to be computed before the final sum can be produced.

Accordingly, to permit a population count in a single CPU cycle, the carry delays are to be minimized. Such a technical problem may be solved using fast logic circuits, however they consume a lot of power. Also, to minimize the delay times internal to the processor, the population count hardware/logic is typically located close to the core of the processor, which restrains the flexibility of the processor designer.

The technical solutions described herein facilitate implementing the population count instruction that addresses the technical problems described above. Additional and or alternative technical advantages of the solutions described herein will be evident to a person skilled in the art upon reading the description herein.

The technical solutions facilitate generating a population count of input data, which can be a byte (8-bits), word (32-bits), half word (16-bits), double word (64-bits), or any other string of bits with fewer or additional number of bits. In one or more examples, the technical solutions herein facilitate accelerating the population count by generating the population count using carry-less counters and a tree of specialized adders. A carry-less counter is an electronic circuit that computes population count on the input using a logic truth table without any carry propagation. Similarly, a specialized adder is an electronic circuit that performs addition without propagating a carry bit that may result from the most significant bit (MSB) of the two operands being added. This specialized adder will produce the correct sum only for a specific range of possible input values that can be applied to its inputs. For example, an addition of "110" and "010" results in "0000" when performed by a 4-bit specialized adder, whereas an addition of "100" and "100" results in "1000" when performed by same adder. For this specialized adder circuit, it can be seen that the MSB of the sum is independent of the carry produced by the lower 3 bits, instead it is only dependent upon the value of the MSBs of the inputs. Therefore by limiting the range of possible input values to the specialized adder and decoupling the sum MSB calculation for the from the carry propagation, the sum MSB can be calculated much more quickly, thus improving the adder speed.

In one or more examples, the technical solutions use divide and conquer to divide the input data into smaller sized bit strings, such as 4-bit wide nibbles. The population count for each smaller-sized bit string, such as the nibble, is determined and further, the counts are summed up to obtain the population count for the input data. The examples of the technical solutions described herein use the 4-bit wide nibble to divide the input data, however it is understood that other examples may use different length bit strings to divide the input data into.

As described before, the summing operations are done using adders. FIG. 1 illustrates an example circuit for generating a population count of a 64-bit input data using a tree of sequential adders. For example, to obtain the population count for the input data, which is a double word (64-bits wide), the sequential tree of adders computes the population counts over 8-bits, 16-bits, 32-bits, and finally 64-bits, that is over byte, half word, word, and double word. Typically, each adder in the sequential tree of adders has to complete its sum before the next adder in the tree can use it, that is the MSB of the sum has to be available to proceed at a next level. In one or more examples, adders use carry propagation techniques to speed up the sum generation. However in adders, the carry propagation to generate the MSB of the sum is a timing critical path and thus, the delay of the adder depends on the MSB carry calculation.

The technical solutions described herein address the technical problem by eliminating the MSB carry calculation and accordingly, speeding up the adder by taking advantage of the value of MSB of the sum produced at each adder in the sequential tree of adders. The technical solutions, thus speed up each adder in the sequential tree by at least 1 logic level. In the above example scenario with the input data being divided into 4-bit wide nibbles, overall, $\log_2(n/4)$ levels of adders are used where n>0 and n=number of bits in the input data word. Accordingly, the technical solutions described herein, eliminate at least $\log_2(n/4)$ levels of logic from the critical path, thus speeding the generation of the population count.

A population count circuitry 100 shown in FIG. 1 includes a set of carry-less population counters 110 where input is k-bits wide, where 'k' represents a maximum number of bits on which the carry-less population counter operates. In this case k is 4, that is the input is a 4-bit string that is divided from the input data, however in other examples, a nibble may include fewer or additional number bits, however, they must be a power of 2, for example 4-bits, 8-bits, 16-bits, etc. A k-bit population counter provides a population count (number of 1s) in a string with k-bits, in this case 4-bit wide string. Accordingly, the length of the divided string limits the maximum input of the k-bit population counters 110, in this case 4 because the input data is divided into 4-bit strings. It is understood that k may be different than 4 in other examples. Because the k-bit population counter operates on a k-bit string, the maximum output of the k-bit population counter is the maximum number represented by $\log_2(k)+1$ bits. For example, when k=4, that is for a 4-bit nibble population counter, the maximum number of is in a 4-bit nibble is 4, which can be represented by 3 bits, that is $\log_2(k)+1$ bits ("100").

The population count circuitry 100 further includes a first set of specialized adders 120, with input operands of $\log_2(k)+1$ bits. The operation of a specialized adder, which eliminates carry propagation delays, is described below.

That is, in this case where k=4, the first set of adders includes 3-bit adders. Further, in this case, an input to each adder in the first set of adders 120 is the 3-bit population count computed over 4-bits (nibble) of the input data word. In general, an input to each adder in the first set of adders 120 is the $\log_2(k)+1$ bit wide output of the k-bit population counters 110. The output of the first set of adders is $\log_2(k)+2$ bits wide. That is, in this case where k=4, the first set of adder outputs are 4-bits wide.

The population count circuitry 100 further includes a second set of specialized adders 130, which input operands of $\log_2(k)+2$ bits and output a corresponding $\log_2(k)+3$ bits wide string. That is, in this case where k=4, the second set of adders 130 includes 4-bit adders such that, the input of each adder in the second set of adders 130 is a 4-bit population count computed over 8-bits (byte) of the 64-bit input data. The second set of adders generate a $\log_2(k)+3$ bits wide output, that is 5-bit output.

The population count circuitry 100 further includes a third set of specialized adders 140, with input operands of $\log_2(k)+3$ bits and generate a corresponding output of $\log_2(k)+4$ bits. That is, in this case where k=4, the third set of adders 140 includes 5-bit adders. An input of each adder in the third set of adders 140 is a 5-bit population count computed over 16-bits (half word) of the 64-bit input data. The population count circuitry 100 further includes a fourth set of specialized adders 150, with input operands of $\log_2(k)+4$ bits and generate a corresponding output of $\log_2(k)+5$ bits. That is, in this case where k=4, the third set of specialized adders 140 includes 6-bit adders. Each input of the adder in the fourth set of specialized adders 150 is a 6-bit population count computed over 32-bits (word) of the 64-bit input data. The population count circuitry 100 may include additional such sequential adders. In one or more examples, the population count circuitry 100 may include $\log_2(n/k)$ sets of adders, where n is the length of the input string, and k is the length of the divided string.

For example, in this particular case, n=64, and k=4. Thus, $\log_2(n/k)=\log_2(64/4)=4$. Accordingly, the output of the fourth set of adders 150 provides the population count for the 64-bit input. Similarly, in case the input was 128-bit wide, that is n=128, with k=4, a fifth set of adders in the sequential tree of adders outputs the population count for the 128-bit input. Further, if the input was 16-bit wide, n=16, the second set of adders 130 outputs the population count, as described earlier.

FIG. 2 illustrates a table for encoding a 4-bit nibble into a 3-bit population count using a k-bit population counter where k is a power of 2. In the table, c0, c1, and c2 are the three bits of the output population count, c2 being the MSB of the output. Further, the corresponding 4-bit inputs and corresponding 16 combinations are illustrated on the left hand side of the table. The 3-bit population count outputs can be generated from the 4-bit inputs using the following equations.

$c2 = A[4*i+3] \&\& A[4*i+2] \&\& A[4*i+1] \&\& A[4*i];$ $c1 = A[4*i] \&\& (A[4*i+2] \hat{} A[4*i+1]) || A[4*i+3] \&\& (A[4*i+2] \hat{} A[4*i]) || A[4*i+1] \&\& (A[4*i+3] \hat{} A[4*i+2]);$ $c0 = A[4*i+3] \hat{} A[4*i+2] \hat{} A[4*i+1] \hat{} A[4*i]$ where i=0, 1, 2, . . . (n/k) for n>0 and n=number of bits in the input data word A[n−1:0]

In the above equations, '^' represents an 'EXCLUSIVE OR' operation, '&&' represents an AND operation, and '||' represents an 'OR' operation. The 4-nibble population counters 110 of the population count circuitry 100 implement logic circuitry according to the above equations. It is understood that the above circuitry could be expanded to a k-bit input data, where k is a power of 2 to generate a $\log_2(k)+1$ population count. As seen above, the 4-bit population counter is carry-less, that is each bit in the output is generated in parallel, without waiting on each other. For example, c0, c1, and c2 are generated independently and concurrently.

Figure 3:
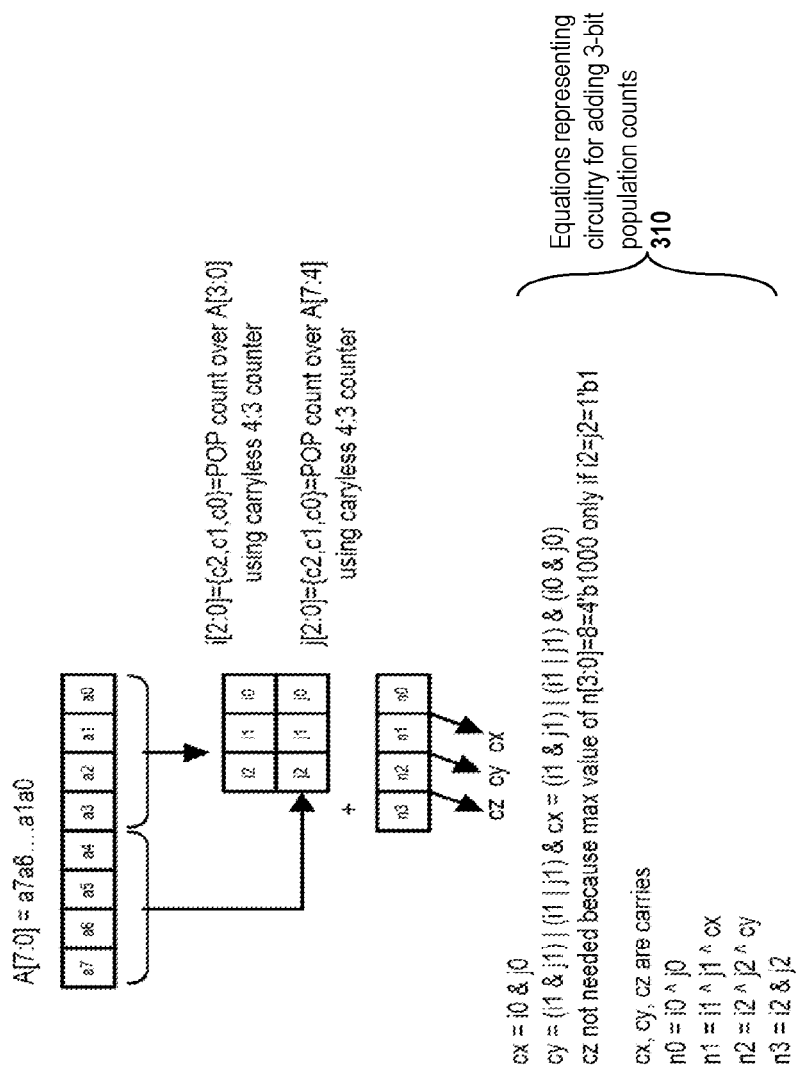
FIG. 3 illustrates an example scenario of determining a population count of a byte (8-bit wide input) using a population count circuitry in accordance with one or more embodiments.

FIG. 3 illustrates an example scenario of determining a population count of a byte (8-bit wide input) using the population count circuitry 100 and the 4-bit population counters that implement the above circuitry. An input string A[7:0] is 8-bit wide. The input string A is divided into two 4-bit nibbles A[3:0] and A[7:4] and input to two 4-nibble population counters that output respective 3-bit population counts, i[2:0] and j[2:0], respectively. Thus, i[2:0] is a 3-bit population count for A[3:0] and j[2:0] is a 3-bit population count for A[7:4]. The population count for the entire byte A[7:0] is obtained by adding the population counts i[2:0] and j[2:0].

FIG. 3 illustrates the sum n[3:0] of the population counts i[2:0] and j[2:0] being generated along with the carries cx, cy, and cz from each of the bits of the population counts. Accordingly, instead of adding a pair of bits and waiting for carry bit to be propagated for adding the next pair of bits, the adder generates the sum of the 3-bit population counts using logic circuitry as represented by equations 310. In FIG. 3, the 3 bits {i2, i1, i0} are equivalent to i[2:0], and the 3 bits {j2, j1, j0} are equivalent to j[2:0]. As illustrated, the carry cx is computed in parallel with the sum of the first pair of bits i0 and j0. Further, the carry cy is also computed in parallel with the sum of the bits, using a circuitry to compute (i1 && j1) || (i1 || j1) && (i0 && j0).

The specialized adder circuit herein does not use the typical carry cz bit, that is the propagated carry bit based on the bits i2, j2 and carry cy. This is because, the 3-bit input population counts i and j have a maximum value of 4 ("100" in binary), and thus, in case both i and j are at the maximum value of 4, the resulting sum is 8 ("1000" in binary), which is represented by n3=1 Thus, n3 is only dependent upon i2 and j2. Accordingly, unlike traditional adders, n3 is not dependent upon i1, i0, j1, j0 because maximum value of {i2, i1, i0} or {j2, j1, j0}≤4 in this case where the input to the adders is the 3-bit population count.

Accordingly, the specialized adder circuit herein computes the values of the bits of the population count n[3:0] using circuitry as per the equations 310. For example, $n[0] = n0 = i0\ \hat{}\ j0;$ $n[1] = n1 = i1\ \hat{}\ j1\ \hat{}\ cx;$ $n[2] = n2 = i2\ \hat{}\ j2\ \hat{}\ cy;$ and $n[3] = n3 = i2 \&\& j2.$ Thus, the specialized adder circuit uses exclusive-or gates to compute the population count bits n[2:0] and uses the 'and' gates for computing n[3]. The inputs to the 'exclusive-or' gates use corresponding bits from i and j along with the corresponding carry bits, which are computed using binary gates as described earlier. Unlike traditional adders, n[3] is independent of carries cy, cx. Instead, n[3] is only dependent i2 and j2. Thus, computing the corresponding population count as described herein eliminates the carry propagation delay into the MSB of the sum which is n[3]

The above equations represent computing a population count for an 8-bit wide string. Repeating the same computations in a loop provides a population count for input string with more bits. For example, for a 64-bit wide input, the above computations are repeated 8 times. Table 1 represents a loop that repeats the computations for 8-bit wide string 8 times.

TABLE 1

```
for (i=0; i<=7; i=i+1)
begin
    cx[i] = c0[2*i+1] && c0[2*i];
    cy[i] = (c1[2*i+1] && c1[2*i]) ||
            (c1[2*i+1] || c1[2*i]) && c0[2*i+1] && c0[2*i];
    n0[i] = c0[2*i+1] ^ c0[2*i];
    n1[i] = c1[2*i+1] ^ c1[2*i] ^ cx[i];
    n2[i] = c2[2*i+1] ^ c2[2*i] ^ cy[i];
    n3[i] = c2[2*i+1] && c2[2*i];
end
```

In one or more examples, the population count circuitry 100 receives the input data for which the population count is to be determined. The input data may be specified directly, for example as a bit string. Alternatively or in addition, the input data may be specified as an input register that contains the bit string for which the population count is to be determined. Alternatively or in addition, the input data may be specified as an input memory location that contains the bit string for which the population count is to be determined. In one or more examples, in addition to the input data, the population count circuitry 100 receives as input, a range of bits within the input data for which the population count is to be generated.

In one or more examples, the population count circuitry 100 outputs the population count as a numeric value. Alternatively or in addition, the population count circuitry 100 stores the population count in a register or a memory location that is specified in the request or command to compute the population count. For example, a population count command may be of the form n[3:0]=POP-COUNT A[7:0], where the population count of a byte (8-bits) in the register A, from bits 7 to 0, is determined and stored in the register n from bits 3 to 0. Alternatively, the command may specify to store the population count in bits 7 to 4 of the register n, for example by specifying n[7:4]=POP-COUNT A[7:0]. Alternatively, the population count command may specify to determine population count of a byte that is represented by bits 15 to 8 of the register A. For example, n[3:0]=POP-COUNT A[15:8].

In one or more examples, the population count command may be of the form n[k*4+3:k*4]=POP-COUNT C[k*8+7:k*8] for k=0, 1, 2, . . . 7, which determines and stores a population count per byte for the 64-bit-string (double word) in the register C[63:0]. As described earlier, computing a sum of the pairs of the population counts per byte results in population count per half-word of the 64-bit string in the register C[63:0]. For example, the population count per half-word may be determined by computing n[k*4+3:k*4]+n[(k+1)*4+3:(k+1)*4] for k=0, 2, 4, 6. In a similar manner, the population counts per word (32-bits) of the 64-bit string in the register C[63:0] are determined by computing the sums according to the following expression.

$$\sum_{i=0}^{i=3} n[(k+i)*4+3:(k+i)*4] \text{ for } k = 0, 4$$

Further, the population counts per double word (64-bits) of register C[63:0] are determined by computing the sums according to the following expression.

$$\sum_{i=0}^{i=7} n[i*4+3:i*4]$$

In one or more examples, the sequential adder tree may be implemented using a single specialized adder. The single adder receives sequential input to sum the population counts from a previous level.

Figure 4:
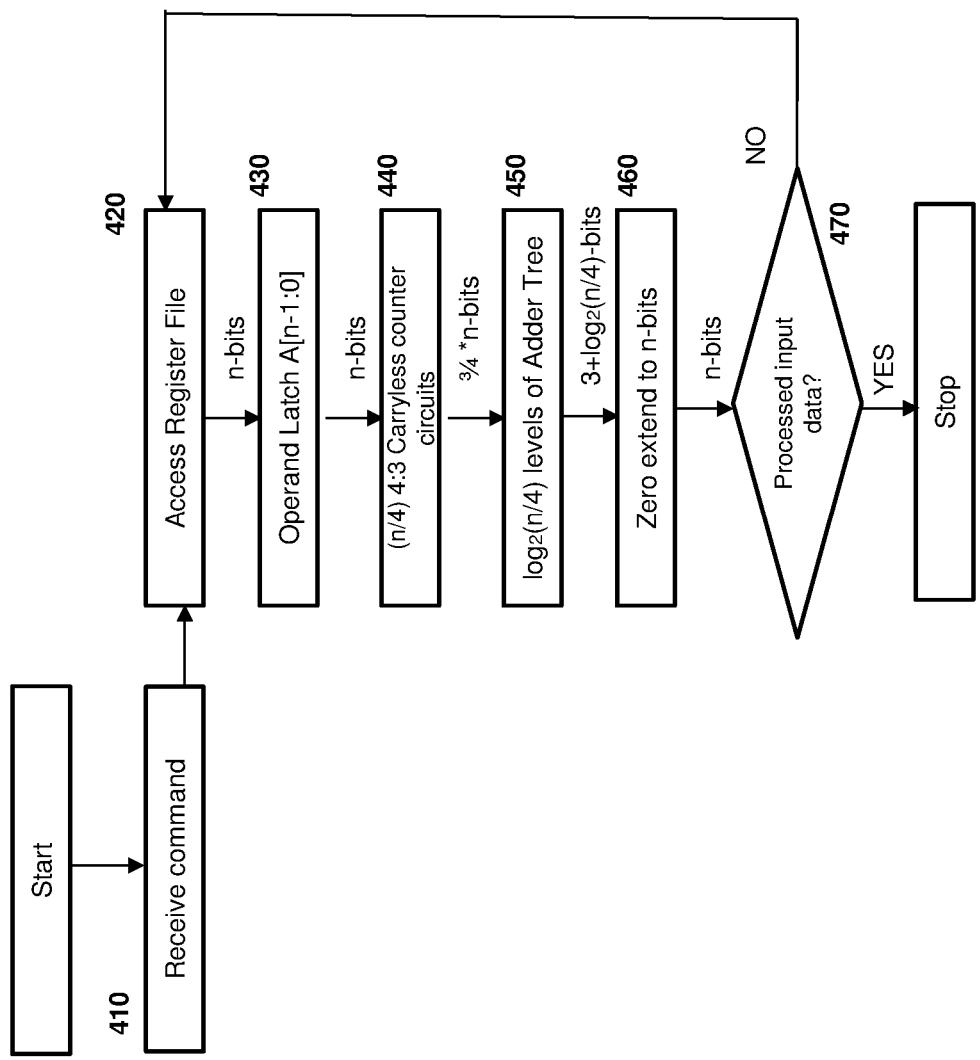
FIG. 4 illustrates a flowchart of an example method for executing a population count command in accordance with one or more embodiments.

FIG. 4 illustrates a flowchart of an example method for executing a population count command. In one or more examples, the population command may be part of an instruction set of a processor, such as a microprocessor. The population command may be received, as shown at block 410. The command specifies the input data. The input data is specified in a register. For example, the input data may be stored in a register. Alternatively or in addition, the register may specify a memory location that contains the input data. The processor accesses the register file to access the input data, as shown at block 420. The processor reads the input data from the operand specified in the command, as shown at block 430. In one or more examples, the population count may latch the input data, which may include n bits. The n-bit data is passed through the 4:3 carry-less counters described herein, as shown at block 440. The population command execution uses n/4 such carry-less counters. The counters output ¾*n bits, which are passed through $\log_2(n/4)$ levels of sequential specialized adder tree as described earlier, as shown in block 450. The result of the adder tree is 3+$\log_2$(n/4) bits, which may be extended (or padded) to n-bits, for example by using 0 (zero) to the left of the MSB. The result may be stored in the register file, or a memory location specified by a register. The processor may determine if the received command specified determining a population count of additional bit string, in which case the processor continues to determine the population count by accessing the bit string, as shown at blocks 470 and 420. Alternatively, if population count of the requested data has been determined, the processor stops the population count determination.

Figure 5:
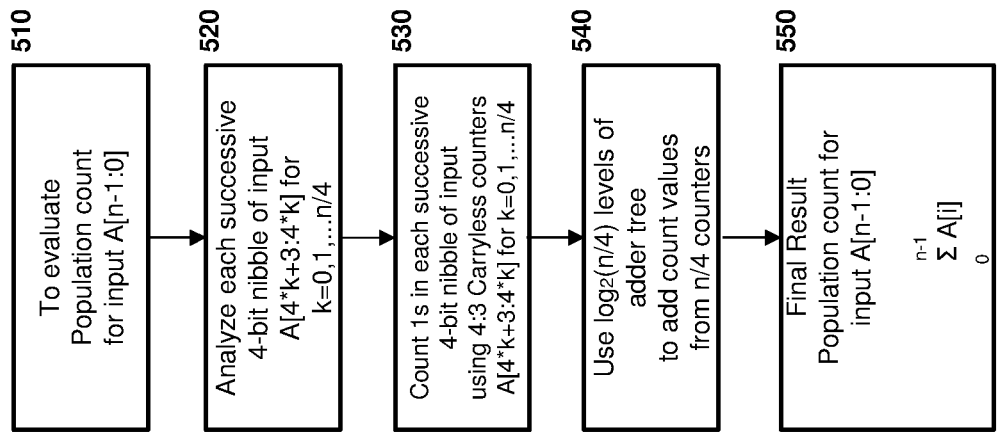
FIG. 5 illustrates a flowchart of an example method for executing the population command in accordance with one or more embodiments.

FIG. 5 illustrates a flowchart of an example method for executing the population command. The population command received may specify to determine the population count of an n-bit input data A[n−1:0], as shown at block 510. The method includes analyzing each 4-bit nibble in the input data A[4*k+3:4*k], k=0, 1, . . . (n/4), as shown at block 520. In one or more examples, the analyzing includes determining a population count of each 4-bit nibble using a 4:3 carry-less counter, as shown at block 530. For n-bit input data, the method uses (n/4) 4:3 counters. The output of the counters is passed through a tree of sequential adders that has $\log_2(n/4)$ levels of specialized adders, as shown at block 540. The specialized adders compute the sums in an expedited manner by eliminating propagating the carry bits as described herein. In one or more examples, the results of the specialized adders are stored back in the register A that is used to latch the input data. Accordingly, the population count is generated and is outputted, as shown at block 550.

Figure 6:
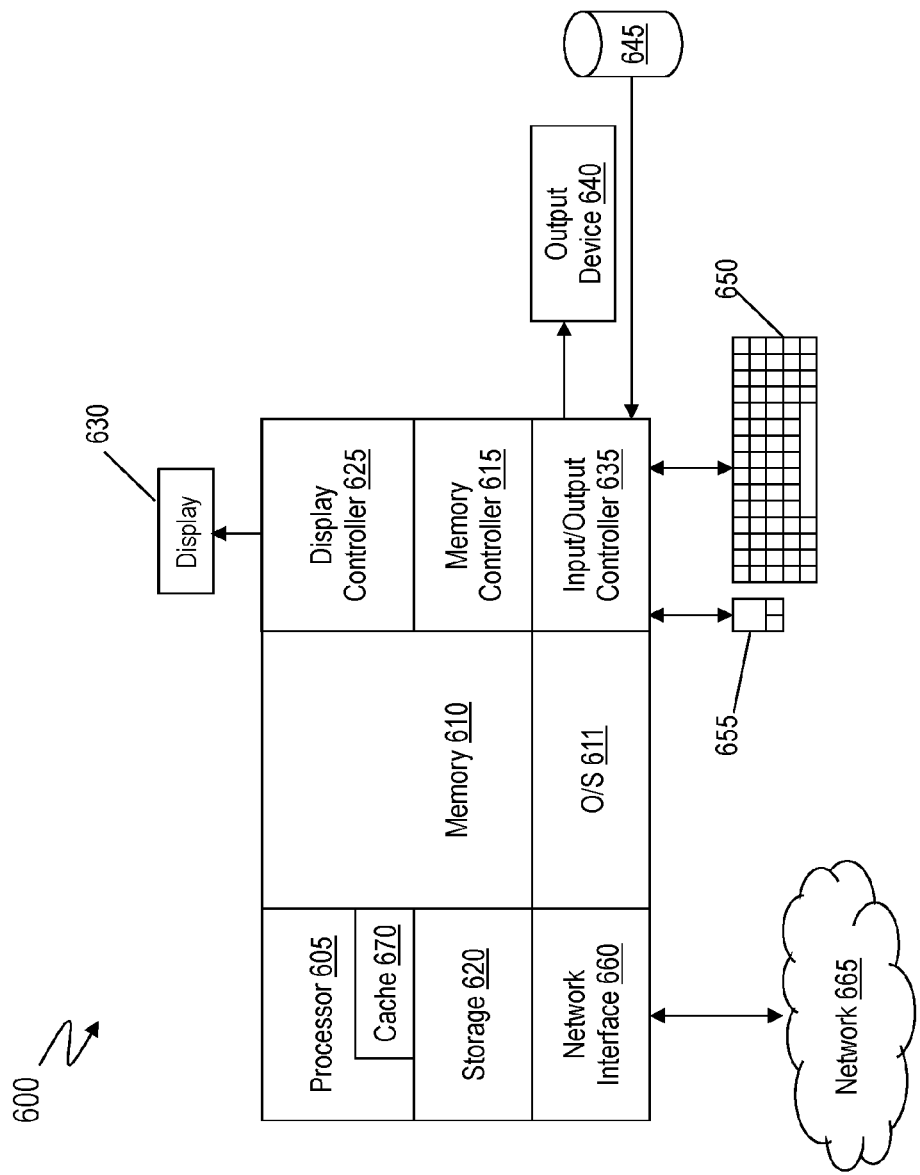
FIG. 6 illustrates an example computing system that facilitates determining a population count of a bit-string in accordance with one or more embodiments.

The processor and/or the population count circuitry 100 described herein may be part of a computing system 600 shown in FIG. 6. The computing system 600 may be a communication apparatus, such as a computer. For example, the computing system 600 may be a desktop computer, a tablet computer, a laptop computer, a phone, such as a smartphone, a server computer, or any other device that communicates via a network 665. The computing system 600 includes hardware, such as electronic circuitry.

The computing system 600 includes, among other components, a processor 605, memory 610 coupled to a memory controller 615, and one or more input devices 645 and/or output devices 640, such as peripheral or control devices that are communicatively coupled via a local I/O controller 635. These devices 640 and 645 may include, for example, battery sensors, position sensors, indicator/identification lights and the like. Input devices such as a conventional keyboard 250 and mouse 255 may be coupled to the I/O controller 635. The I/O controller 635 may be, for example, one or more buses or other wired or wireless connections, as are known in the art. The I/O controller 635 may have additional elements, which are omitted for simplicity, such as controllers, buffers (caches), drivers, repeaters, and receivers, to enable communications.

The I/O devices 640, 645 may further include devices that communicate both inputs and outputs, for instance disk and tape storage, a network interface card (MC) or modulator/demodulator (for accessing other files, devices, systems, or a network), a radio frequency (RF) or other transceiver, a telephonic interface, a bridge, a router, and the like.

The processor 605 is a hardware device for executing hardware instructions or software, particularly those stored in memory 610. The processor 605 may be a custom made or commercially available processor, a central processing unit (CPU), an auxiliary processor among several processors associated with the computing system 600, a semiconductor based microprocessor (in the form of a microchip or chip set), a macroprocessor, or other device for executing instructions. The processor 605 includes a cache 670, which may include, but is not limited to, an instruction cache to speed up executable instruction fetch, a data cache to speed up data fetch and store, and a translation lookaside buffer (TLB) used to speed up virtual-to-physical address translation for both executable instructions and data. The cache 670 may be organized as a hierarchy of more cache levels (L1, L2, and so on.).

The memory 610 may include one or combinations of volatile memory elements (for example, random access memory, RAM, such as DRAM, SRAM, SDRAM) and nonvolatile memory elements (for example, ROM, erasable programmable read only memory (EPROM), electronically erasable programmable read only memory (EEPROM), programmable read only memory (PROM), tape, compact disc read only memory (CD-ROM), disk, diskette, cartridge, cassette or the like). Moreover, the memory 610 may incorporate electronic, magnetic, optical, or other types of storage media. Note that the memory 610 may have a distributed architecture, where various components are situated remote from one another but may be accessed by the processor 605.

The instructions in memory 610 may include one or more separate programs, each of which comprises an ordered listing of executable instructions for implementing logical functions. In the example of FIG. 2, the instructions in the memory 610 include a suitable operating system (OS) 611. The operating system 611 essentially may control the execution of other computer programs and provides scheduling, input-output control, file and data management, memory management, and communication control and related services.

Additional data, including, for example, instructions for the processor 605 or other retrievable information, may be stored in storage 620, which may be a storage device such as a hard disk drive or solid state drive. The stored instructions in memory 610 or in storage 620 may include those enabling the processor to execute one or more aspects of the systems and methods of this disclosure.

The computing system 600 may further include a display controller 625 coupled to a user interface or display 630. In some embodiments, the display 630 may be an LCD screen. In other embodiments, the display 630 may include a plurality of LED status lights. In some embodiments, the computing system 600 may further include a network interface 660 for coupling to a network 665. The network 665 may be an IP-based network for communication between the computing system 600 and an external server, client and the like via a broadband connection. In an embodiment, the network 665 may be a satellite network. The network 665 transmits and receives data between the computing system 600 and external systems. In some embodiments, the network 665 may be a managed IP network administered by a service provider. The network 665 may be implemented in a wireless fashion, for example, using wireless protocols and technologies, such as WiFi, WiMax, satellite, or any other. The network 665 may also be a packet-switched network such as a local area network, wide area network, metropolitan area network, the Internet, or other similar type of network environment. The network 665 may be a fixed wireless network, a wireless local area network (LAN), a wireless wide area network (WAN) a personal area network (PAN), a virtual private network (VPN), intranet or other suitable network system and may include equipment for receiving and transmitting signals.

Accordingly, the technical solutions described herein facilitate determining a population count using a carry-less 4:3 counter and specialized adder circuits. A processor may include electronic circuitry to compute the population count using binary logic gates as described herein. Alternatively or in addition, the processor may determine the population count using computer executable instructions according to the logic described herein.

The present technical solutions may be a system, a method, and/or a computer program product at any possible technical detail level of integration. The computer program product may include a computer readable storage medium (or media) having computer readable program instructions thereon for causing a processor to carry out aspects of the present technical solutions.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers, and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present technical solutions may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present technical solutions.

Aspects of the present technical solutions are described herein with reference to flowchart illustrations and/or block diagrams of methods, apparatus (systems), and computer program products according to embodiments of the technical solutions. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present technical solutions. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

A second action may be said to be "in response to" a first action independent of whether the second action results directly or indirectly from the first action. The second action may occur at a substantially later time than the first action and still be in response to the first action. Similarly, the second action may be said to be in response to the first action even if intervening actions take place between the first action and the second action, and even if one or more of the intervening actions directly cause the second action to be performed. For example, a second action may be in response to a first action if the first action sets a flag and a third action later initiates the second action whenever the flag is set.

To clarify the use of and to hereby provide notice to the public, the phrases "at least one of <A>, <B>, . . . and <N>" or "at least one of <A>, <B>, <N>, or combinations thereof" or "<A>, <B>, . . . and/or <N>" are to be construed in the broadest sense, superseding any other implied definitions hereinbefore or hereinafter unless expressly asserted to the contrary, to mean one or more elements selected from the group comprising A, B, . . . and N. In other words, the phrases mean any combination of one or more of the elements A, B, . . . or N including any one element alone or the one element in combination with one or more of the other elements, which may also include, in combination, additional elements not listed.

It will also be appreciated that any module, unit, component, server, computer, terminal or device exemplified herein that executes instructions may include or otherwise have access to computer readable media such as storage media, computer storage media, or data storage devices (removable and/or non-removable) such as, for example, magnetic disks, optical disks, or tape. Computer storage media may include volatile and non-volatile, removable and non-removable media implemented in any method or technology for storage of information, such as computer readable instructions, data structures, program modules, or other data. Such computer storage media may be part of the device or accessible or connectable thereto. Any application or module herein described may be implemented using computer readable/executable instructions that may be stored or otherwise held by such computer readable media.

The descriptions of the various embodiments of the present technical solutions have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application, or technical improvement over technologies found in the marketplace, or to enable others of ordinary skill in the art to understand the embodiments disclosed herein.

What is claimed is:

1. A population count circuit that determines a population count of an n-bit input bit-string, wherein:
   the population count circuit is configured to output the population count, wherein the population count is a number of 1s in the n-bit input bit-string; and
   the population count circuit comprises:
   a carryless counter circuit configured to determine a pair of 3-bit counts of 1 s, one for each 4-bit nibble from a pair of 4-bit nibbles from an n-bit input bit-string input to the population count circuit; and
   an adder circuit configured to determine the population count by summing the pair of 3-bit counts of 1s from the carryless counter circuit corresponding to each 4-bit nibble, the adder circuit comprising a plurality of adders that perform the summing without propagating a carry bit that results from a most significant bit (MSB) of a sum of the pair of 3-bit counts of 1s being added, the plurality of adders setup as a sequential tree to propagate the 3-bit counts, where the tree comprises $\log_2(n/4)$ levels, and wherein:
   at level k of the tree, k being 2 to log 2(n/4), the 3-bit counts from a level k−1 of the tree in consecutive pairs are used by a first adder to determine the MSB of the sum based on the MSBs of the 3-bit counts only, without depending on carry propagation;
   at level k of the tree, results from the level k−1 of the tree are added by a second adder for sum bits other than the MSB; and
   result of additions at level log 2(n/4) of the tree is output as the population count of the n-bit input bit-string.

2. The population count circuit of claim 1, wherein the carryless counter circuit comprises logic gates configured to receive the pair of 4-bit nibbles from the n-bit input bit-string and output a corresponding 3-bit count value by adding the pair of 4-bit nibbles.

3. The population count circuit of claim 2, wherein the adder circuit is a 4-bit adder that receives the pair of counts of 1s as 3-bit count values from the carryless counter circuit and outputs the sum as a 4-bit value.

4. The population count circuit of claim 1, wherein the adder circuit computes the MSB of the sum by computing a bitwise AND operation on the MSBs of the 3-bit counts of 1s.

5. The population count circuit of claim 4, wherein the adder circuit computes a first carry bit by computing a bitwise AND operation on the least significant bits of the counts of 1s.

6. The population count circuit of claim 1, wherein a number of bits output by adders in each successive level of the tree increases by 1 bit.

7. The population count circuit of claim 6, wherein a maximum value of an output of adders at $n^{th}$ level is limited to $2^{(n+2)}$.

8. The population count circuit of claim 6, wherein population count values for each byte of the n-bit input bit-string are generated at level 1 of the tree of adders.

9. The population count circuit of claim 6, wherein population count values for each half word of the n-bit input bit-string are generated at level 2 of the tree of adders.

10. The population count circuit of claim 6, wherein population count values for each word of the n-bit input bit-string are generated at level 3 of the tree of adders.

11. The population count circuit of claim 6, wherein population count values for each double word of the n-bit input bit-string are generated at level 4 of the tree of adders.

12. The population count circuit of claim 1, wherein each adder from the plurality of adders perform the summing of the pair of 3-bit counts that are received as input by performing the following computations:

$cx=i0\&j0;$ $cy=(i1\&j1)|(i1|j1)\&cx;$ $n0=i0\textasciicircum j0;$ $n1=i1\textasciicircum j1\textasciicircum cx;$ $n2=i2\textasciicircum j2\textasciicircum cy;$ and n3=i2 & j2, where [n3–n0] is a 3-bit result of summing a first 3-bit count [i3–i0] and a second 3-bit count [j3–j0] and cx and cy are carries corresponding to bits (i0, j0) and (i1, j1) respectively.

13. A computer program product for determining a population count for a bit-string, the computer program product comprising a computer readable storage medium, the computer readable storage medium comprising computer executable instructions, wherein the computer readable storage medium comprises instructions to:
   divide an input bit-string into 4-bit nibbles;
   determine 3-bit population count values corresponding to the 4-bit nibbles respectively;
   propagate the 3-bit population count values through an adder circuit that comprises a plurality of adders that are setup to propagate the 3-bit population count values to perform a sequential tree of additions without propagating a carry bit that results from a most significant bit (MSB) of a sum of a pair of the 3-bit population count values, where the tree comprises $\log_2(n/4)$ levels, wherein n is a number of bits in the input bit-string, and wherein:
   at level k of the tree, k being 2 to $\log_2(n/4)$, consecutive pairs of the 3-bit population count values from a level k−1 of the tree are used to determine the most significant bit (MSB) of a sum based on the MSBs of the count values only, without depending on carry propagation; and
   at level k of the tree, results from the level k−1 of the tree are added for sum bits other than the MSB; and
   output result of additions at level $\log_2(n/4)$ of the tree as the population count of the input bit-string.

14. The computer program product of claim 13, wherein at the level 1, the MSB of the sum is determined by computing a bitwise AND operation on the MSBs of the 3-bit counts values.

15. The computer program product of claim 13, wherein a number of bits output by additions in each successive level of the tree increases by 1 bit.

16. The computer program product of claim 13, wherein at each level k, addition of the pair of 3-bit counts that are received as input is performed according to the following computations:

$cx = i0 \& j0;$ $cy = (i1 \& j1) | (i1 | j1) \& cx;$ $n0 = i0 \^{} j0;$ $n1 = i1 \^{} j1 \^{} cx;$ $n2 = i2 \^{} j2 \^{} cy;$ and n3=i2 & j2, where [n3–n0] is a 3-bit result of summing a first 3-bit count [i3–i0] and a second 3-bit count [j3–j0] and cx and cy are carries corresponding to bits (i0, j0) and (i1, j1) respectively.

* * * * *